(12) United States Patent
Fujinaga et al.

(10) Patent No.: US 7,452,798 B2
(45) Date of Patent: Nov. 18, 2008

(54) SEMICONDUCTOR CHIP MOUNTING SUBSTRATE, A METHOD OF PRODUCING THE SAME, AND A METHOD OF MOUNTING A SEMICONDUCTOR CHIP

(75) Inventors: Takeru Fujinaga, Tokyo (JP); Kazuhiro Hirose, Tokyo (JP); Hideaki Takemori, Tokyo (JP); Toshiaki Koizumi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/747,344

(22) Filed: May 11, 2007

(65) Prior Publication Data
US 2007/0207557 A1    Sep. 6, 2007

Related U.S. Application Data

(62) Division of application No. 11/056,169, filed on Feb. 14, 2005.

(30) Foreign Application Priority Data
Mar. 29, 2004  (JP) .............................. 2004-093999

(51) Int. Cl.
H01L 21/44    (2006.01)

(52) U.S. Cl. ...................................................... 438/612
(58) Field of Classification Search ................. 257/734, 257/782, 779, E33.001; 438/612, 614, 666
See application file for complete search history.

(56) References Cited

U.S. PATENT DOCUMENTS 7,009,299 B2 *  3/2006  Angst et al. ................. 257/772

FOREIGN PATENT DOCUMENTS

JP          2001-57468 A       2/2001

* cited by examiner

*Primary Examiner*—Nathan W Ha
(74) *Attorney, Agent, or Firm*—Crowell & Moring LLP

(57) ABSTRACT

A chip mounting substrate for bonding a semiconductor chip to a substrate, comprises a solder layer on the substrate, the solder layer being connectable to a semiconductor chip, wherein the solder layer comprises a layer including δ-phase crystal grains of an Au—Sn alloy at a surface of the solder layer. The solder layer comprising a layer including δ-phase crystal grains of an Au—Sn alloy is formed at a surface of the solder layer. On mounting a semiconductor chip on the substrate, the substrate and the solder layer are heated and an image of the solder layer is shot to perform an image evaluation to detect the timing of mounting the semiconductor chip on the solder layer of the substrate and a position of the chip.

34 Claims, 4 Drawing Sheets

SEMICONDUCTOR CHIP MOUNTING SUBSTRATE, A METHOD OF PRODUCING THE SAME, AND A METHOD OF MOUNTING A SEMICONDUCTOR CHIP

This application is a divisional of U.S. patent application Ser. No. 11/056,169, filed Feb. 14, 2005, the entire disclosure of which is incorporated herein by reference, which in turn claims priority under 35 U.S.C. § 119 of prior Japanese application no. 2004-093999, filed Mar. 29, 2004.

FIELD OF THE INVENTION

The present invention relates to a semiconductor chip mounting substrate, a method of producing the same, and a method of mounting a semiconductor chip.

BACKGROUND OF THE INVENTION

A technology for bonding a semiconductor chip to a substrate is known. Japanese laid-open patent application publication No. 2001-57468 discloses such a soldering technology for bonding a semiconductor chip on a substrate.

In the circuit device disclosed in the above publication, with a thin solder layer, a chip is bonded to a substrate. The device comprises a substrate with a metallization layer on the surface thereof, a chip, and a solder layer for bonding the chip to the metallization layer on the substrate to mount the chip on the substrate.

The solder layer comprises an Au—Sn alloy having a eutectic composition defined by a eutectic point of Au—Sn alloy. The Au—Sn alloy includes Sn of 29 at. % and the balance Au. The eutectic point is 278° C. In this circuit device, there are further provided barrier layers between the solder layer and the metallization layer to prevent a reaction between the solder layer and the Au layer and between the solder layer and a metal layer in the metallization layer, respectively. The barrier layer comprises a δ-phase Au—Sn alloy. In this circuit device, it is difficult to detect timing of mounting a semiconductor chip on the substrate and a mounting position of the semiconductor chip on the melting solder layer on the substrate.

SUMMARY OF THE INVENTION

An aspect of the present invention provides a layer comprising δ-phase crystal grains of an Au—Sn alloy at the outer surface of the solder layer on a substrate on the side of bonding a semiconductor chip.

Another aspect of the present invention provides a method of mounting a semiconductor chip on a substrate with monitoring a melting behavior about the surface condition of the solder layer of the substrate through image evaluation to detect a timing of mounting the semiconductor chip on the substrate and a location at a surface of the solder layer where the chip is to be mounted.

A further aspect of the present invention provides a chip mounting substrate comprising: a substrate; and a solder layer on the substrate, the solder layer being connectable to a semiconductor chip, wherein the solder layer comprises a layer including δ-phase crystal grains of an Au—Sn alloy at a surface of the solder layer.

A still further aspect of the present invention provides a chip mounting substrate comprising: a substrate; and a solder layer on the substrate, the solder layer being connectable to a semiconductor chip, wherein the solder layer comprises at an outer surface of the solder layer a marker layer comprising a composition of an Au—Sn alloy in which, when the solder layer melts, crystal grains are precipitated to provide a visual indication that the solder layer melts.

A still further aspect of the present invention provides a method of mounting a semiconductor chip on a substrate, comprising the steps of: preparing a chip mounting substrate comprising a solder layer including a layer comprising δ-phase crystal grains of an Au—Sn alloy at a surface of the solder layer; heating the chip mounting substrate to melt the solder layer; shooting an image of a surface of the solder layer to detect the melting condition of the layer including the δ-phase crystal grains of the Au—Sn alloy; evaluating a shot image to recognize the melting condition of the layer including a δ-phase crystal grains of the Au—Sn alloy; and mounting the semiconductor chip on the solder layer on the basis of the detected melting condition.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Figure 1:
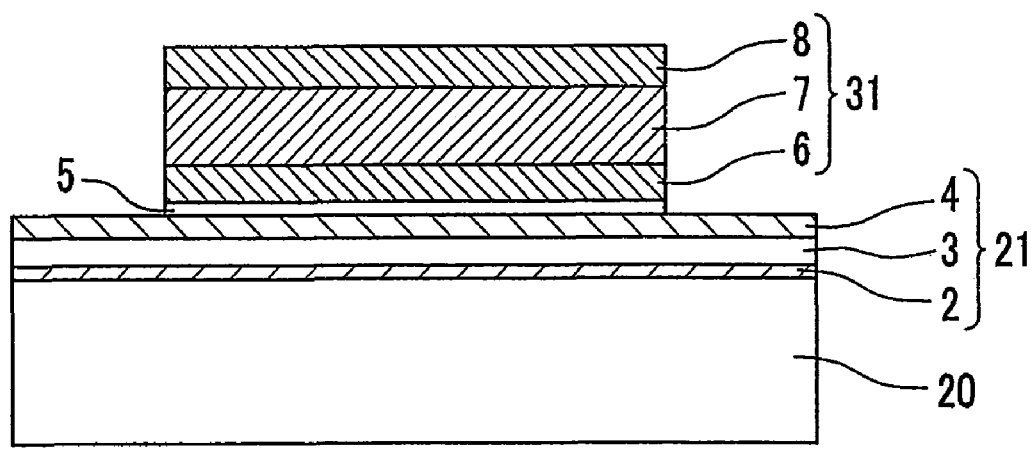
FIG. 1 is a cross-sectional view of a chip mounting substrate of an embodiment according to the present invention.

On mounting a chip on a substrate heated to a temperature higher than a melting point of solder, timing of mounting the chip on the substrate can be determined by monitoring the surface of the melted solder layer of the substrate with a CCD (Charge Coupled Device) camera or the like. The CCD camera scans the surface of the solder layer which is being heated to detect a change of the surface conditions before and after melting.

However, in the related art disclosed in Japanese laid-open patent application publication No. 2001-57468 mentioned earlier, the Au—Sn solder having the eutectic composition has a flat surface before and after melting, which provides a difficulty in recognizing the melting condition from the image data shot by the CCD camera. This may result in erroneous mounting the chip with respect to timing and a mounting position of the chip on a melting layer of the substrate.

More specifically, in the above-described related art, the Au—Sn solder having the eutectic composition has a flat surface before and after melting. Thus, though the surface condition is monitored with the CCD camera, the change of the surface condition cannot be detected before and after melting since the surface is flat and smooth before and after the melt of the solder layer. Thus, the mounting position of the chip and the mounting timing may be erroneously recognized. In the case of such a trouble, a mounting machine may mount the semiconductor chip at a displaced position or may not start mounting the chip though the solder layer has melted. Further, the mounting machine may mount the chip after a significant delay from when the solder layer is melt. Furthermore, with passage of time from when the solder has melted, diffusion of Au in the metallization layer into the solder layer may proceed, so that the solder composition becomes Au-richer than the eutectic composition.

When becoming Au-rich, the composition enters a composition region where a ζ-phase Au—Sn alloy is precipitated, so that a temperature of liquidus rapidly increases as it departs from the eutectic point. Accordingly, at general bonding temperatures (from 330 to 350° C.), the composition enters a coexistence region allowing the ζ-phase Au$_5$Sn to coexist with a liquid phase, so that the ζ-phase Au—Sn alloy is precipitated, which results in coagulation of a part of the solder.

Then, if the semiconductor chip is mounted with delay from melting of the solder layer, the electrode layer on the surface of the chip and the solder layer are insufficiently wet, so that the chip is not strongly bonded to the substrate.

To prevent the erroneous mounting, according to the present invention, there is provided a layer including crystal grains of a δ-phase Au—Sn alloy on the surface of the solder layer for bonding.

Hereinafter, a method of bonding a semiconductor chip on a substrate including a metallization layer on the substrate with an Au-Su alloy (Au—Sn eutectic solder) or the like with a eutectic composition will be described.

First, a metallization layer is formed on a surface of a substrate on which a semiconductor chip is to be mounted by a film forming method such as vapor deposition and spattering. On the metallization layer, a photoresist patterned by a photolithographic technique is formed. After that, a solder layer is formed on the photoresist and uncovered part of the metallization layer by a film forming method such as vapor deposition and spattering and then patterned through a lift off process. At the last, a bonding surface of the semiconductor chip is bonded to the solder layer on the substrate. In this embodiment, the substrate comprises a ceramic substrate such as SiC and AlN since the ceramic substrate has a high electrical insulation and a high thermal conductivity. However, the substrate is not limited to the ceramic substrate. For example, an Si substrate and other substrates can be used.

In this process, generally, the semiconductor chip is automatically mounted on the substrate with a mounting machine. There are two cases of mounting, namely, one case where the chip is mounted before heating and melting the solder and the other case where the chip is mounted after heating and melting the solder. In the latter case, the mounting machine should determine the position where the chip is mounted and the timing of mounting the chip on the substrate. For the purpose to this, while the substrate is heated up to a temperature higher than the melting point of the solder, the solder layer on the substrate is shot with a CCD camera cooperatively operating with the mounting machine. In this operation, the position at the substrate where the chip should be mounted is determined from the detected position of the solder layer from the image and the timing when the chip is to be mounted on the solder layer is determined by detecting the change of the surface condition of the solder layer accompanying the melt of the solder layer, from an image shot by the CCD camera.

In the embodiment according to the present invention, the substrate comprises the solder layer for bonding the semiconductor chip on the substrate, and during mounting the chip on the substrate, a melting behavior is recognized from the image of the surface of the solder layer outputted by the CCD camera or the like to prevent erroneous bonding with a specific structure provided to the solder layer.

More specifically, on the outer surface of the solder layer for bonding the chip to the substrate, a layer including crystal grains of the δ-phase Au—Sn alloy is formed. For example, the solder layer is formed on a metallization layer on the surface of the substrate. The solder layer comprises two solid rich layers and a liquid rich layer which is a eutectic composition defined by the eutectic point of the Au—Sn alloy, in which these layers are vertically accumulated in order of the solid rich layer, the liquid rich layer, the solid rich layer from the near side to the substrate. In this structure, each layer is designed to be in equilibrium at a specific temperature range. Furthermore, between the metallization layer and the solder layer, a metal layer such as Pt or Ni or the like is provided for diffusion protection of Au in the metallization layer.

Embodiment

An embodiment according to the present invention will be described with reference to FIGS. 1, 2, 3A to 3G, and 4. FIG. 1 illustrates a cross-sectional view of a chip mounting substrate according to this embodiment.

Figure 2:
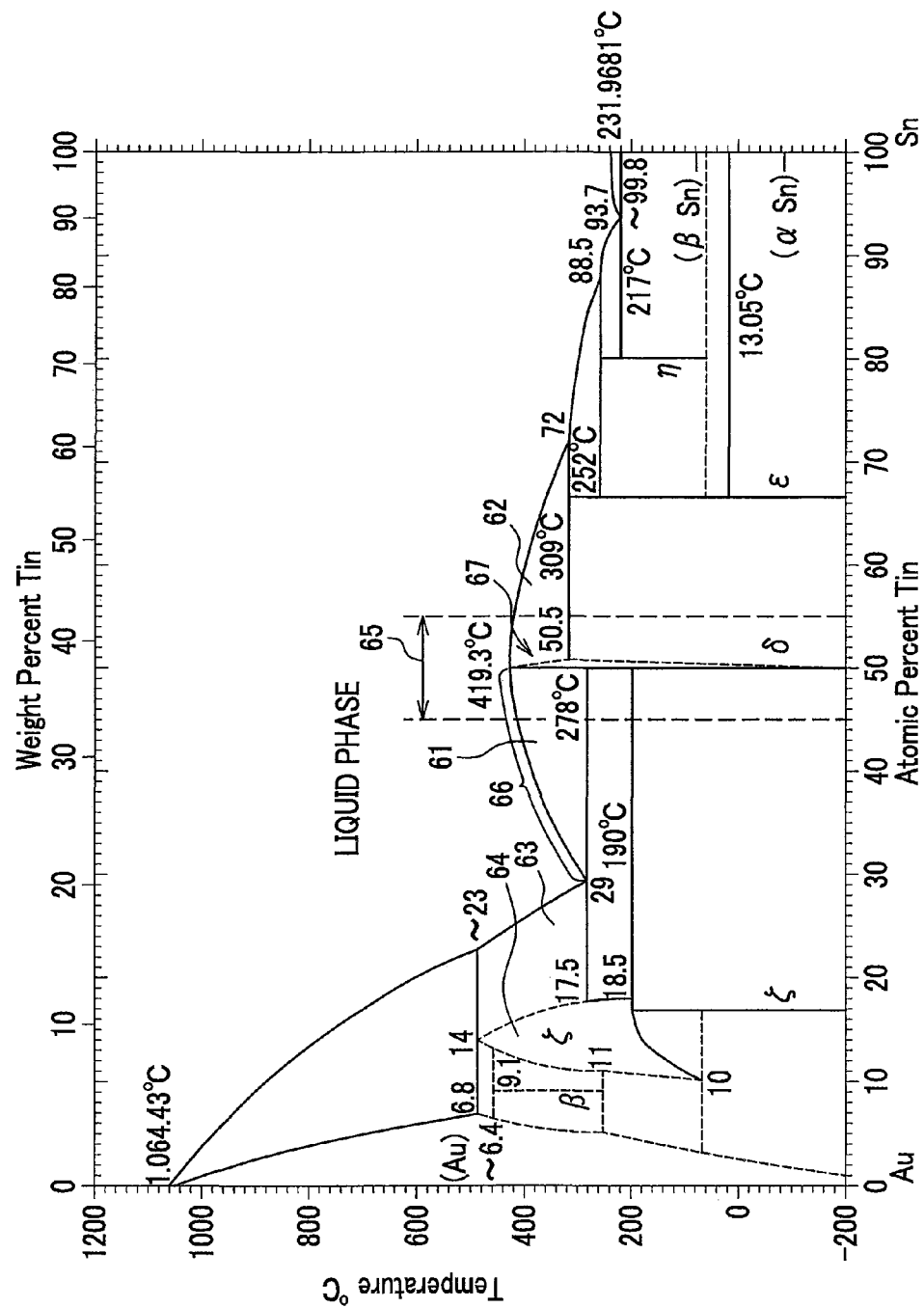
FIG. 2 is a binary equilibrium phase diagram of Au—Sn alloys for illustrating compositions of the solder layer according to the present invention.

FIG. 2 illustrates a binary equilibrium phase diagram of Au-Su alloys according to this embodiment. In FIG. 2, a region 61 is a coexistence region between a δ phase and a liquid phase; a region 62 is a coexistence region between a δ phase and a liquid phase; a region 63 is a coexistence region between a ζ phase and a liquid phase; and a region 64 is a region of the ζ phase. A curve 66 represents a liquidus. The δ phase comprises a compound of AuSn and the ζ phase comprises a compound of Au$_5$Sn. The liquidus 66 indicates an Au—Sn composition of a liquid phase in an equilibrium condition with δ-phase (An-Sn composition) at a predetermined temperature within a temperature range from 278° C. to 419.3° C.

Figure 3A:
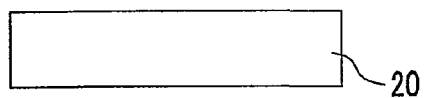
FIGS. 3A to 3F are cross-sectional views illustrating a method of producing the chip mounting substrate according to the present invention.
Figure 3E:
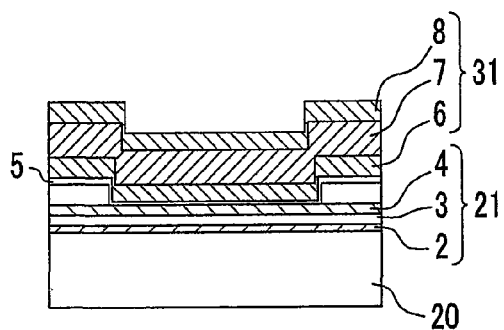
Figure 3B:
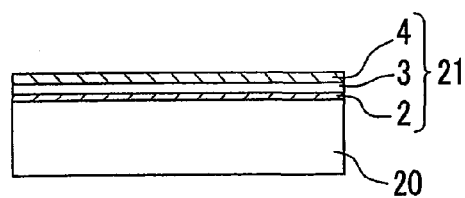
Figure 3F:
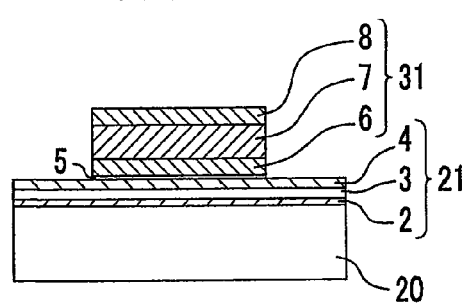
Figure 3C:
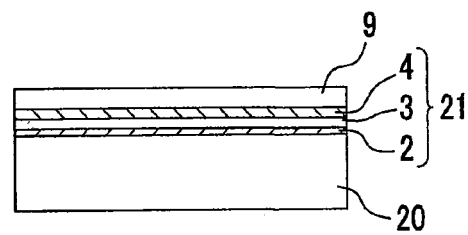
Figure 3G:
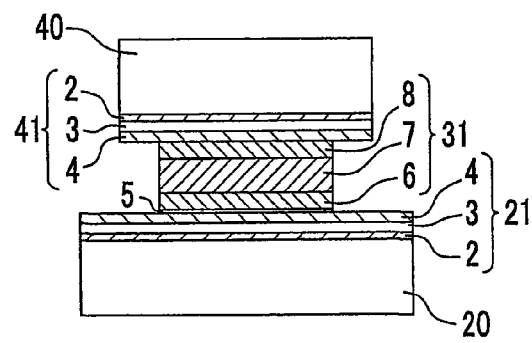
FIG. 3G is a cross-sectional view illustrating a method of mounting a semiconductor chip according to the present invention.

FIGS. 3A to 3H illustrate a production process of the chip mounting substrate. FIGS. 3G and 4 illustrate a mounting process of a chip on the substrate, according to this embodiment.

As shown in FIG. 1, the chip mounting substrate comprises a metallization layer 21 on a surface of a substrate 20 and a solder layer 31 on the metallization layer 21.

The metallization layer 21 comprises a bonding layer 2 on the surface of the substrate 20 such as a Ti layer and a Cr layer which are made of metal materials each having a high bonding characteristic, a metal layer 3 on the bonding layer 2 such as Pt, Ni, and Cu, and an Au layer 4 arranged on the metal layer 3 for oxidation prevention. More specifically, the bonding layer 2, the metal layer 3, and the Au layer 4 are sequentially formed in this order from the side of the substrate 20.

The solder layer 31 comprises solid rich layers 6 and 8 including crystal grains of a δ-phase Au—Sn alloy, and a liquid rich layer 7 which includes a eutectic composition defined by the eutectic point of the Au—Sn alloy. In other words, three layers including the solid rich layer 6, the liquid rich layer 7, and the solid rich layer 8 are vertically deposited on the metallization layer 21 in this order.

As shown in FIG. 2, in Au—Sn alloys, there is a coexistence region between the δ-phase and the liquid phase. This shows that the δ-phase Au—Sn alloy (solid phase) at a given temperature not lower than 278° C. and not higher than 419.3° C. is in equilibrium with the Au—Sn alloy (liquid phase) comprising a composition defined on the liquidus 66. More specifically, at any given temperature within the temperature range not lower than 278° C. and not higher than 419.3° C., if the Au—Sn alloy (liquid phase) and the δ-phase Au—Sn alloy (solid phase) are in contact with each other, neither the solid phase is dissolved in the liquid phase nor does the liquid phase coagulate. In other words, the solid phase and the liquid phase coexist. Accordingly, at a given temperature not lower than 278° C. and not higher than 419.3° C. on mounting the chip on the substrate 20, the δ-phase Au—Sn alloy in the solid rich layer exists without dissolution of the δ-phase Au—Sn alloy solid in the liquid rich layer, and also the liquid phase portion in the liquid rich layer can exist without coagulation.

In this embodiment, the specific compositions of the solid rich layer 6 and the solid rich layer 8 exist at the δ-phase composition region 67 of which width is narrow and centered on Au50 at. %-Sn50 at. % which corresponds to the composition of the δ phase (See FIG. 2).

As mentioned above, the layer including the δ-phase crystal grains of Au—Sn alloy is provided in the solid rich layer 8 which is an outer surface of the solder layer for connection with the semiconductor chip. Thus, when the solder layer is melted by being heated during mounting, the δ-phase crystal grains (solid) are precipitated in the solid rich layer 8 which makes the surface of the outer layer of the solder layer uneven, resulting in the change of the surface condition of the solder. Thus, the solid rich layer 8 at the outer surface of the solder layer 31 indicating the change of the surface condition functions as a marker indicating start of melting of the solder. This facilitates the image recognition by shooting the surface image of the solder layer 31 with the CCD camera or the like.

Further, in the solid rich layer 6 that is the lower layer of the solder layer 31, the δ-phase crystal grains (solid) function as a barrier layer so as to prevent the melting portion of the liquid rich layer 7 from reaching the metallization layer 21 and to prevent the Au layer 4 in the metallization layer 21 from diffusing into the melting portion of the liquid rich layer 7. If Au diffuses in the solder layer 31, the equilibrium condition among the solid rich layers 6 and 8 and the rich layer 7 in the solder layer 31 cannot be maintained because the composition of the solder layer becomes Au rich.

More specifically, the above-mentioned operation is provided with the structure in which the liquid rich layer 7 comprising the eutectic composition defined by the eutectic point of the Au—Sn alloy is sandwiched between the solid rich layers 6 and 8 that are layers including crystal grains of the δ phase of the Au—Sn alloy.

The compositions of the solid rich layer 6 and 8 may be slightly deviated from the above-mentioned δ-phase composition region. More specifically, the solid rich layers 6 and 8 can be made from Au—Sn alloys in which Sn is not smaller than 45 at. % and not higher than 55 at. %, and the balance is Au as shown by a range 65 in FIG. 2. Using such a composition for the solid rich layers 6 and 8, on heating the substrate 20 during mounting, for example, the crystal grains of the δ-phase (solid) and the liquid phase coexist in the solid rich layers 6 and 8. Here, if the ratio is in the composition range in which Sn is not smaller than 45 at. % and not higher than 55 at. %, because an amount of the produced liquid rich layer is small, the solid rich layer 8 at the outer surface can function as the marker indicating the start of melting with the δ-phase crystal grains, and the solid rich layer 6 at the bottom layer of the solder layer 31 can function as a barrier layer.

On the other hand, the liquid rich layer 7 that is one of layers in the solder layer 31 comprises an Au—Sn alloy with the eutectic composition in this embodiment, namely, Au71 at. %-Sn29 at. % (See FIG. 2). More specifically, two layers 6 and 7 are vertically deposited. The liquid rich layer 7 has a function for wetting and spreading over a surface of an electrode layer of the semiconductor chip in addition to keeping the equilibrium condition with the solid rich layers 6 and 8.

Further, the liquid rich layer 7 may have any composition other than this composition. More specifically, the liquid rich layer 7 can be made of Au—Sn alloy comprising Sn of not smaller than 29 at. % and not greater than 50 at. %, because, as shown in FIG. 2, an Au—Sn alloy with a composition at a temperature defined on the liquidus 66 in a range not smaller than 278° C. and not greater than 419.3° C. is in equilibrium with the δ phase in the solid rich layers 6 and 8. In this case, during bonding, the bonding temperature is set to the liquidus temperature of the liquid rich layer 7. This provides the equilibrium condition on bonding, which makes the outer surface of the solid rich layer 8 rough on melting. This acts as a marker indicating the start of melting. The solid rich layer 6 at the bottom layer of the solder layer 31 acts as a barrier layer for preventing the melting part of the liquid rich layer 7 from reaching the metallization layer 21 and the Au in the metallization layer 21 from diffusing into the solder layer 31.

Though the Au—Sn alloy comprises Sn of not smaller than 29 at. % and not greater than 50 at. %, as increase in the ratio of Sn, the liquidus temperature increases, so that the bonding temperature should be increased. Thus, to decrease the bonding temperature, it is preferable that the ratio of Sn is smaller than 45 at. %.

In this embodiment, a Pt layer 5 is arranged as a barrier layer between the solder layer 31 and the metallization layer 21. The Pt layer 5 prevents the Au in the Au layer 4 from diffusing in the solder layer 31, which results in keeping the Au—Sn compositions of the solder layer 31 stable. Thus, the Pt layer 5 is an important barrier layer in preventing the diffusion of Au existing outside the solder layer and also in holding three layers including the solid rich layer 6, the solid rich layer 8, and the liquid rich layer 7 and in keeping equilibrium conditions at respective interfaces.

As mentioned above, the solid rich layer 6 at the bottom layer of the solder layer 31 similarly acts as a barrier layer as well. However, the Pt layer 5 provides a higher barrier operation. The barrier layer may comprise a metal layer such as Ni capable of providing the barrier effect for preventing the Au from diffusing.

Further, the chip mounting substrate 20 may include a structure including no barrier layers. However, it is preferable to arrange the barrier layer from the point of view of holding the compositions of the solder layer 31, and keeping the equilibrium condition between the layers in the solder layer 31.

A method of producing the chip mounting substrate and a method of mounting the semiconductor chip on the substrate will be described with reference to FIGS. 3A to 3G. FIG. 4 is an illustration showing the mounting process.

In FIG. 3A, the substrate 20 is prepared in a substrate preparing process. In a metallization process shown in FIG. 3B, the bonding layer 2, the metal layer 3, the Au layer 4 are formed in this order as the metallization layer 21 by vapor deposition.

In a photoresist process shown in FIG. 3C, photoresist 9 is coated over the whole surface of the metallization layer 21.

Figure 3D:
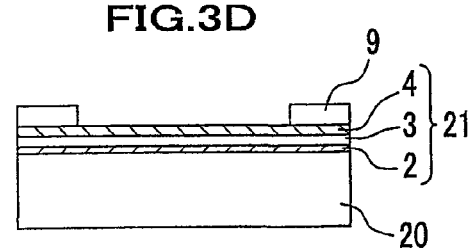
Figure 4:
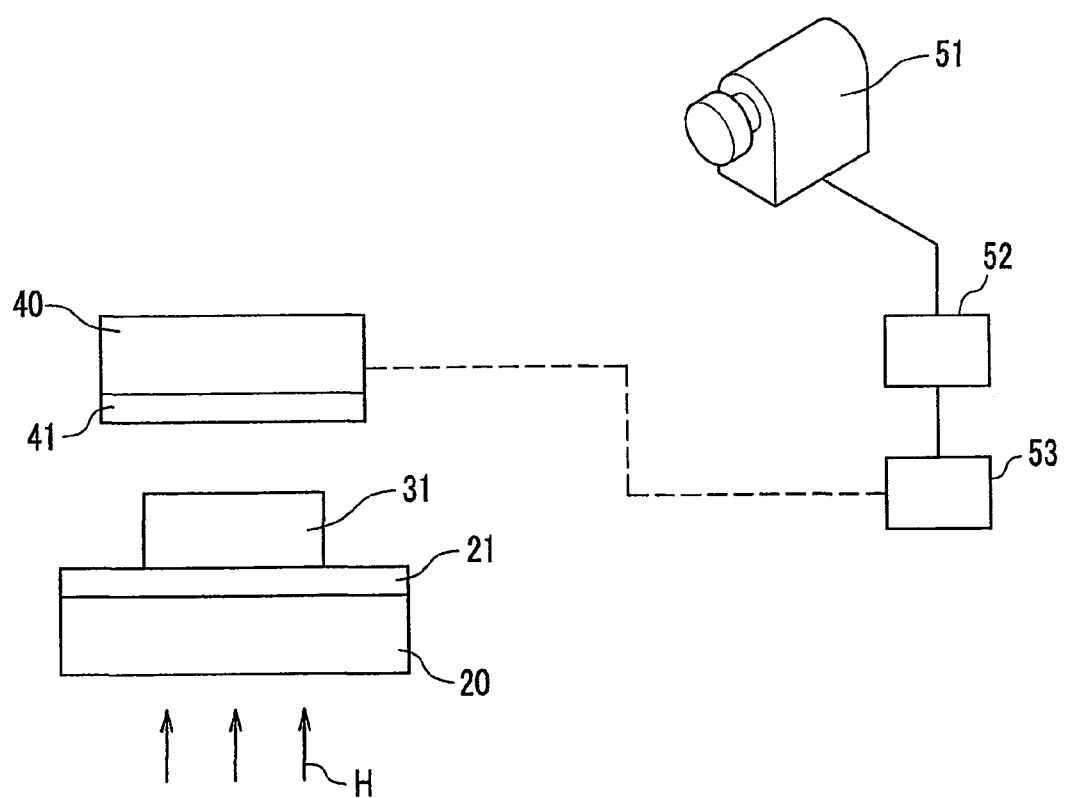
FIG. 4 is an illustration showing the mounting process according to the present invention.

In a photolithography process shown in FIG. 3D, the coated photoresist 9 is patterned by a photolithographic process.

In a solder layer forming process shown in FIG. 3E, the Pt layer 5, that is, the barrier layer, and the solder layer 31 are formed in this order by the vapor deposition on the whole surface of the pattern of the photoresist 9 and the surface of the metallization layer 21. In this process, the solder layer 31 is formed to have a structure including the solid rich layer 6, the liquid rich layer 7, and the solid rich layer 8 arranged in this order from the side of the metallization layer 21. In this process, to make the solid rich layers 6 and 8 have a composition at the δ-phase region of the Au—Sn alloy (Au50 at. %-Sn50 at. %), rates of sources of Au and Sn are controlled during the vapor deposition. Further, the liquid rich layer 7 is formed to have the eutectic composition of Au—Sn (Au71 at. %-Sn29 at. %) by controlling the rates of the sources.

In a lift off process shown in FIG. 3F, a lift off process is carried out to pattern the Pt layer 5 of a barrier and the solder layer 31.

In the bonding process shown in FIG. 3G and FIG. 4, to bond the semiconductor chip 40 to the substrate 20, the substrate 20 is heated up by heat H to a predetermined bonding temperature. During this, to perform the image recognition for detecting melting of the solder layer, the solder layer 31 is shot by a CCD camera 51 cooperatively running with a mounting machine 53. The bonding temperature is defined as a temperature at which the solder layer 31 melts. In this embodiment, the bonding temperature is determined as 278° C. because the liquidus temperature of the solder layer 31 is the eutectic point 278° C. In this condition, the liquid rich layer 7 melts. On the other hand, the solid rich layer 6 and the solid rich layer 8 that are δ-phase Au—Sn alloys remain solids and are in equilibrium. Further, the δ-phase crystal grains (solid) generate unevenness (not flat) on the surface of the solder layer 31, resulting in a change in the surface condition of the solder layer. The image of the surface of the solder layer 31 is shot by the CCD camera 51 to detect and recognize the change of the surface condition of the solder layer with an image recognition section 52. When the change of the surface condition is detected and judged by the image recognition section 52, the position of the solder layer 31 is detected, and the mounting machine 53 starts mounting the semiconductor chip 40 on the substrate 20 in accordance with the detected position of the solder layer 31.

As mentioned above, the solid rich layer 8 including the δ-phase crystal grains of the Au—Sn alloy is heated to be melt with observing the melting condition using the image recognition section 52. Then, the semiconductor chip 40 is soldered by controlling the mounting machine 53 as the result of the image recognition section 52. This provides the recognition of the melting condition based on the roughness at the surface of the solder layer 31 provided by the formation of the δ-crystal grains (solid), so that the timing of mounting the semiconductor chip 40 and the position of the semiconductor chip 40 with respect to the surface of the solder layer 31 can be appropriately determined, which results in reduction in the level of troubles in mounting the chip 40 such as poor contact.

At the bonding surface of the semiconductor chip 40, the electrode layer 41 is formed in advance. The electrode layer 41 comprises three layers including the bonding layer 2, the metal layer 3, and the Au layer 4 in the same manner as the metallization layer 21.

When the semiconductor chip 40 is mounted on the substrate 20, a melting part in the solid rich layer 8 at the outer surface of the solder layer 31 wets and spreads over the surface of the metallization layer 40. Further, in the solid rich layer 6 at the bottom layer, the δ-phase crystal grains (solid) act as a barrier layer to keep the equilibrium conditions between the solid rich layer 6 and the liquid rich layer 7 and between the solid layer 8 and the liquid rich layer 7 and to prevent the Au in the metallization layer 21 from diffusing into the liquid rich layer 7, which suppresses the richness of Au in the composition of the liquid rich layer 7 and precipitation of the ζ phase ($Au_5Sn$). Thus, the liquid rich layer 7 keeps a stable melting condition without change in the composition.

After that, the substrate 20 is cooled. This causes precipitation of δ-phase eutectic and ζ-phase eutectic, and turns the liquid rich layer 7 into a solid phase of the eutectic structure, which bonds to the solid rich layer 6 beneath the liquid rich layer 7 and to the solid rich layer 8 over the liquid rich layer 7. In this process, the liquid rich layer 7 is different in composition from the solid rich layer 6 and the solid rich layer 8. However, since any of them is an Au—Sn alloy, the liquid rich layer 7 has a high bonding characteristic to the solid rich layer 6 and to the solid rich layer 8, so that a strong bonding is provided. Further, in a melting portion of the solid rich layer 8 at the outer surface wetting and spreading over the Au layer 4a, the δ-phase and the ζ-phase eutectic are precipitated, resulting in a solid phase of the eutectic composition which bonds to the metallization layer 21.

In this embodiment, according to the above described method of producing a chip mounting substrate and method of mounting a chip on a substrate, the semiconductor chip 40 can be mounted on a substrate 20. The chip mounting substrate comprising the solder layer 31 as mentioned-above, so that, on mounting the semiconductor chip 40 on the substrate 20, the solder layer 31 can provide melting behavior based on the visual surface condition detected by the CCD camera 51 through the image recognition to determine the timing of mounting the chip and the location where the chip is to be mounted. This reduces the possibility of poor contact between the substrate and the chip.

The invention claimed is:

1. A method of producing a chip mounting substrate connectable to a semiconductor chip, comprising:
   forming a first solder layer on a substrate; and
   forming a second solder layer comprising δ-phase crystal grains of an Au—Sn alloy at an outer surface of the first solder layer, externally exposed as a marker layer in which, when the first solder layer melts, the crystal grains are precipitated to provide a visual indication that the solder layer melts, with a change from a flat surface to an uneven surface at a predetermined soldering temperature of the first solder layer.

2. The method as claimed in claim 1, wherein the first solder layer comprises two layers vertically arranged to a surface of the substrate, wherein the two layers comprise different compositions in Au and Sn from each other.

3. The method as claimed in claim 1, wherein the first solder layer comprises a layer comprising δ-phase crystal grains of an Au—Sn alloy and a third layer comprising a eutectic composition defined by a eutectic point of the Au—Sn alloy, and wherein the third layer is sandwiched between the layer and the second layer.

4. The method as claimed in claim 1, wherein the second solder layer including the δ-phase crystal grains of the Au—Sn alloy comprises an average composition of Sn of not smaller than 45 at. % and not greater than 55 at. % and a balance of Au.

5. The method as claimed in claim 1, further comprising the step of forming a metallization layer between the substrate and the first solder layer, wherein the first solder layer comprises a lower layer in contact with the metallization layer comprising an average composition of Sn of not smaller than 45 at. % and not greater than 55 at. % and a balance of Au.

6. The method as claimed in claim 1, wherein the first solder layer comprises a lower layer and an intermediate layer between the second layer and the lower layer, and wherein the intermediate layer comprises an Au—Sn alloy including an average composition of Sn of not smaller than 29 at. % and not greater than 45 at. % and a balance of Au.

7. The method as claimed in claim 1, wherein the first solder layer comprises a lower layer and an intermediate layer between the second layer and the lower layer, and wherein each of the second layer, the intermediate layer, and the lower layer comprises a material showing an equilibrium condition at a predetermined temperature at an interface with neighboring one of the layer, the intermediate layer, and the lower layer.

8. The method as claimed in claim 1, further forming a metallization layer between the substrate and the first solder layer; and forming a metal layer between the first solder layer and the metallization layer, the metallization layer comprising an Au layer comprising Au, and wherein the metal layer prevents the Au in the Au layer from diffusing in the first solder layer.

9. A method of mounting a semiconductor chip on a substrate comprising:
preparing a chip mounting substrate comprising a solder layer comprising a layer including δ-phase crystal grains of an Au—Sn alloy at a surface of the solder layer;
heating the chip mounting substrate to melt the solder layer;
shooting an image of a surface of the solder layer to recognize the melting condition of the layer including the δ-phase crystal grains of the Au—Sn alloy;
evaluating the shot image to recognize the melting condition of the layer including the δ-phase crystal grains of the Au—Sn alloy; and
mounting the semiconductor chip on the solder layer on the basis of the detected melting condition.

10. The method as claimed in claim 9, wherein the solder layer comprises two layers vertically arranged to a surface of the substrate, wherein the two layers comprise different compositions in Au and Sn from each other.

11. The method as claimed in claim 9, wherein the solder layer further comprises a second layer comprising δ-phase crystal grains of an Au—Sn alloy and a third layer comprising a eutectic composition defined by a eutectic point of the Au—Sn alloy, and wherein the third layer is sandwiched between the layer and the second layer.

12. The method as claimed in claim 9, wherein the Au—Sn alloy in the layer comprises an average composition of Sn of not smaller than 45 at. % and not greater than 55 at. % and a balance of Au.

13. The method as claimed in claim 9, further comprising forming a metallization layer between the substrate and the solder layer, wherein the solder layer further comprises a lower layer in contact with the metallization layer comprising an average composition of Sn of not smaller than 45 at. % and not greater than 55 at. % and a balance of Au.

14. The method as claimed in claim 9, wherein the solder layer further comprises a lower layer and an intermediate layer between the layer including δ-phase crystal grains of an Au—Sn alloy and the lower layer, and wherein the intermediate layer comprises an Au—Sn alloy including an average composition of Sn of not smaller than 29 at. % and not greater than 45 at. % and a balance of Au.

15. The method as claimed in claim 9, wherein the solder layer further comprises a lower layer and an intermediate layer between the layer including δ-phase crystal grains of an Au—Sn alloy and the lower layer, and wherein each of the layer including δ-phase crystal grains of an Au—Sn alloy, the intermediate layer, and the lower layer comprises a material showing an equilibrium condition at a predetermined temperature at an interface with neighboring one of the layer including δ-phase crystal grains of an Au—Sn alloy, the intermediate layer, and the lower layer.

16. The method as claimed in claim 9, further comprising forming a metallization layer under the solder layer and a metal layer between the solder layer and the metallization layer, the metallization layer comprising an Au layer comprising Au, and wherein the metal layer prevents the Au in the Au layer from diffusing in the solder layer.

17. A method of producing a chip mounting substrate connectable to a semiconductor chip, comprising:
forming a first solder layer on a substrate; and
forming a second solder layer comprising δ-phase crystal grains of an Au—Sn alloy on the first solder layer to provide a marker layer as an outer layer of a solder layer including the first and second solder layers, the marker layer comprising a composition of an Au—Sn alloy in which, when the solder layer melts, crystal grains are precipitated to provide a visual indication that the solder layer melts.

18. The method as claimed in claim 17, wherein the first solder layer comprises two layers vertically arranged to a surface of the substrate, wherein the two layers comprise different compositions in Au and Sn from each other.

19. The method as claimed in claim 17, wherein the first solder layer comprises a layer comprising δ-phase crystal grains of an Au—Sn alloy and a third layer comprising a eutectic composition defined by a eutectic point of the Au—Sn alloy, and wherein the third layer is sandwiched between the layer and the second layer.

20. The method as claimed in claim 17, wherein the second solder layer including the δ-phase crystal grains of the Au—Sn alloy comprises an average composition of Sn of not smaller than 45 at. % and not greater than 55 at. % and a balance of Au.

21. The method as claimed in claim 17, further comprising forming a metallization layer between the substrate and the first solder layer, wherein the first solder layer comprises a lower layer in contact with the metallization layer comprising an average composition of Sn of not smaller than 45 at. % and not greater than 55 at. % and a balance of Au.

22. The method as claimed in claim 17, wherein the first solder layer comprises a lower layer and an intermediate layer between the second layer and the lower layer, and wherein the intermediate layer comprises an Au—Sn alloy including an average composition of Sn of not smaller than 29 at. % and not greater than 45 at. % and a balance of Au.

23. The method as claimed in claim 17, wherein the first solder layer comprises a lower layer and an intermediate layer between the second layer and the lower layer, and wherein each of the second layer, the intermediate layer, and the lower layer comprises a material showing an equilibrium condition at a predetermined temperature at an interface with neighboring one of the layer, the intermediate layer, and the lower layer.

24. The method as claimed in claim 17, further comprising forming a metallization layer under the substrate and the solder layer; and
forming a metal layer between the solder layer and the metallization layer, the metallization layer comprising an Au layer comprising Au, and wherein the metal layer prevents the Au in the Au layer from diffusing in the solder layer.

25. A method of mounting a semiconductor chip on a substrate comprising:
preparing a chip mounting substrate comprising:
a substrate; and
a solder layer on the substrate, the solder layer being connectable to a semiconductor chip, wherein the solder layer comprises at an outer surface of the solder layer a marker layer comprising a composition of an Au—Sn alloy in which, when the solder layer melts, crystal grains are precipitated to provide a visual indication that the solder layer melts;

heating the chip mounting substrate to melt the solder layer;

shooting an image of a surface of the marker layer to recognize the melting condition of the marker layer;

evaluating the shot image to recognize the melting condition of the marker layer; and mounting the semiconductor chip on the solder layer on the basis of the detected melting condition.

26. The method as claimed in claim 25, wherein the solder layer comprises two layers vertically arranged to a surface of the substrate, wherein the two layers comprise different compositions in Au and Sn from each other.

27. The method as claimed in claim 25, wherein the solder layer further comprises a second layer comprising δ-phase crystal grains of an Au—Sn alloy and a third layer comprising a eutectic composition defined by a eutectic point of the Au—Sn alloy, and wherein the third layer is sandwiched between the layer and the second layer.

28. The method as claimed in claim 25, wherein the Au—Sn alloy in the layer comprises an average composition of Sn of not smaller than 45 at. % and not greater than 55 at. % and a balance of Au.

29. The method as claimed in claim 25, wherein the chip mounting substrate further comprises a metallization layer under the solder layer, wherein the solder layer further comprises a lower layer in contact with the metallization layer comprising an average composition of Sn of not smaller than 45 at. % and not greater than 55 at. % and a balance of Au.

30. The method as claimed in claim 25, wherein the solder layer further comprises a lower layer and an intermediate layer between the layer including δ-phase crystal grains of an Au—Sn alloy and the lower layer, and wherein the intermediate layer comprises an Au—Sn alloy including an average composition of Sn of not smaller than 29 at. % and not greater than 45 at. % and a balance of Au.

31. The method as claimed in claim 25, wherein the solder layer further comprises a lower layer and an intermediate layer between the layer including δ-phase crystal grains of an Au—Sn alloy and the lower layer, and wherein each of the layer including δ-phase crystal grains of an Au—Sn alloy, the intermediate layer, and the lower layer comprises a material showing an equilibrium condition at a predetermined temperature at an interface with neighboring one of the layer including δ-phase crystal grains of an Au—Sn alloy, the intermediate layer, and the lower layer.

32. The method as claimed in claim 25, further comprising forming a metallization layer under the solder layer and a metal layer between the solder layer and the metallization layer, the metallization layer comprising an Au layer comprising Au, and wherein the metal layer prevents the Au in the Au layer from diffusing in the solder layer.

33. A method of producing a chip mounting substrate connectable to a semiconductor chip, comprising:

forming a first solder layer on a substrate; and forming a second solder layer comprising δ-phase crystal grains of an Au—Sn alloy on the first solder layer, wherein forming the first solder layer comprises the step of forming two layers vertically arranged to a surface of the substrate, wherein the two layers comprise different compositions in Au and Sn from each other.

34. A method of producing a chip mounting substrate connectable to a semiconductor chip, comprising:

forming a first solder layer on a substrate; and forming a second solder layer comprising first and second layers each comprising δ-phase crystal grains of an Au—Sn alloy and a third layer comprising a eutectic composition defined by a eutectic point of the Au—Sn alloy, and wherein the third layer is sandwiched between the first and second layers.

* * * * *